United States Patent [19]

Maes

[11] 4,381,981
[45] May 3, 1983

[54] SACRIFICIAL CATHODIC PROTECTION SYSTEM

[75] Inventor: Jean P. Maes, Merelbeke, Belgium

[73] Assignee: S. A. Texaco Belgium N.V., Brussels, Belgium

[21] Appl. No.: 217,268

[22] Filed: Dec. 17, 1980

[51] Int. Cl.³ .............................................. C23F 13/00
[52] U.S. Cl. ..................................... 204/197; 204/148
[58] Field of Search ................ 204/147, 148, 196, 197; 307/577, 448

[56] References Cited

U.S. PATENT DOCUMENTS

| | | | |
|---|---|---|---|
| 3,313,958 | 4/1967 | Bowers | 307/577 |
| 3,330,751 | 7/1967 | Warner | 204/196 |
| 3,360,452 | 12/1967 | McNulty | 204/197 |
| 3,362,900 | 1/1968 | Sabins | 204/196 |
| 3,374,162 | 3/1968 | Rubelmann | 204/196 |
| 3,451,311 | 10/1969 | Hospord | 204/196 |
| 4,224,539 | 9/1980 | Musa et al. | 307/362 |

*Primary Examiner*—T. Tung
*Attorney, Agent, or Firm*—Carl G. Ries; Robert A. Kulason; Henry C. Dearborn

[57] ABSTRACT

Corrosion protection is provided to a metallic structure by a sacrificial anode system. A current control element is used to achieve fast and adequate corrosion protection under changing conditions, while excess current flow is minimized to extend anode life and avoid overprotection. The basic advantages of sacrificial anode systems such as simplicity and autonomy are retained. The system employs a field effect or a MOS (metal oxide silicon) semiconductor device to act as the current control element.

1 Claim, 5 Drawing Figures

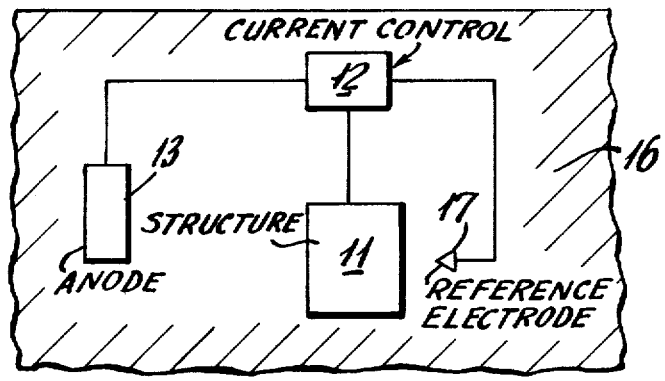
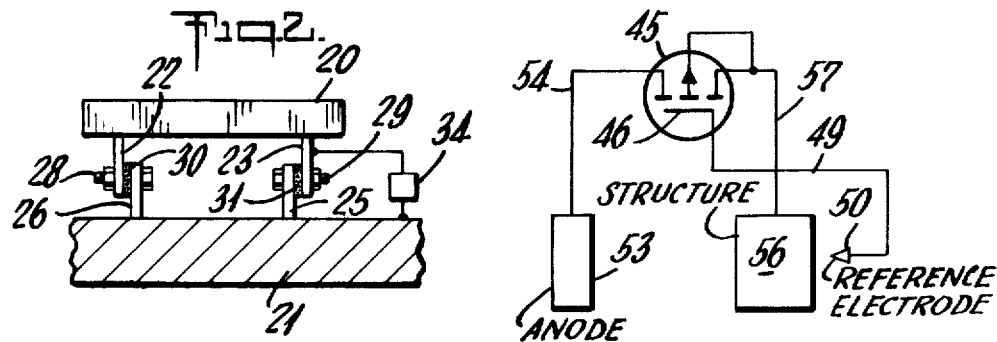
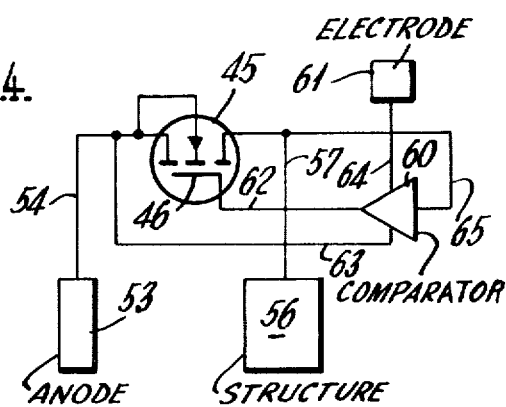
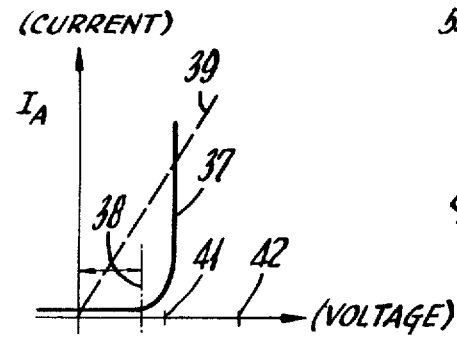

SACRIFICIAL CATHODIC PROTECTION SYSTEM

BACKGROUND OF THE INVENTION

1. Field of the Invention

This invention relates to sacrificial cathodic protection systems and particularly to a new technique for effective and economical corrosion protection of periodically immersed structures.

Corrosion of metals in moist soil and seawater is basically due to electro-chemical reactions, involving the corroding metal and the corrosive environment or electrolyte.

It is known that cathodic polarization reduces the corrosion rate by suppressing metal dissolution and accelerating reduction reactions. Application of a cathodic potential to a metallic structure, can be effected by an external power supply (Impressed Current Cathodic Protection), or by galvanic coupling to a more anodic material (Sacrificial Cathodic Protection).

Because of its simplicity and autonomy, sacrificial cathodic protection is widely applied for the prevention of corrosion of underground structures, harbour installations, marine vessels and off-shore constructions.

2. Description of the Prior Art

Hitherto, sacrificial cathodic protection systems have been designed according to potential and current density criteria, depending essentially on the structure to be protected, the type of anode material, the corrosive environment and the projected service life.

In practice, allowances are made for anode consumption and deterioration in time, to ensure that the criteria for corrosion protection are met during the entire design life of a sacrificial protection system.

For applications to structures subject to periodic immersion, e.g. structures subject to tide or groundwater level fluctuations, ballast water tanks, and cargo-ballast tanks in seagoing vessels, additional protection is required to ensure fast polarization during the successive immersion periods.

Cathodic protection systems, thus designed have not met with unqualified success. In order to provide cathodic protection over an extended period of time, the sacrificial anodes used must be large and numerous enough to provide adquate current flow up until their normal time of replacement. This inevitably results in either overdimensioning of the system leading to anode wastage and problems associated with overprotection (e.g. cathodic disbonding of coating systems, hydrogen evolution, undesired build up of calcareous deposits), or underdimensioning, penalized by an increased corrosion rate, or the need for more frequent anode replacements. These disadvantages can be offset by regulating the anode current output, so that overprotection and anode wastage is avoided.

There is a U.S. Pat. No. 3,360,452, issued Dec. 26, 1967, to F. E. McNulty, which is concerned with a cathodic protection system, basically like to the type of system which this application involves.

A power transistor is used to regulate the anode current output, in order to maintain the potential of the structure at a predetermined level.

The effectiveness of such system is however significantly reduced by the offset voltage drop accross the transistor emittor-collector junctions.

It is an object of the present invention to provide improved means for regulating the current output of a sacrificial anode, or of a group of anodes. The superior characteristics of fieldeffect or MOS (metal oxide silicon) semi-conductor switches are used. These switches have no offset in the ON condition, allowing optimized use of the anode driving power. This is of particular importance in applications where fast restoration of cathodic polarization is required.

Consequently, it is another object of this invention to provide a sacrificial anode type of cathodic protection, which has superior ability to provide fast restoration of protective potentials, e.g. in the case where the protected structures are periodically immersed. It is a further object of this invention to eliminate any need for an external power supply for operation of the current regulating device or auxiliary circuitry.

In addition, it provides a substantial saving in anode consumption, so that the life of the sacrificial anode or anodes employed is greatly increased.

SUMMARY OF THE INVENTION

The invention is related to a sacrificial cathodic protection system, involving a metallic structure subject to being contacted by an electrolyte. In such a system the invention concerns improvement which comprises a field effect or a MOS (metal oxide silicon) switching device and a sacrificial anode to provide said protection. It also comprises circuit means for connecting said device between said anode and said structure. The said device has predetermined characteristics for controlling the amount of protective current flow from said sacrificial anode to said structure automatically depending upon the potential difference between said anode and said structure.

According to another aspect of the invention, the improvement comprises a field effect or a MOS device having a gate, and a sacrificial anode to provide said protection.

It also comprises a reference electrode for contacting said electrode, and first circuit means for connecting said device to said anode. It also comprises second circuit means for connecting said device to said structure, and third circuit means for connecting said reference electrode to said gate.

The said device has predetermined characteristics for controlling the amount of protective current flow from said sacrificial anode to said structure automatically depending upon the potential difference between said reference electrode and said structure. The invention also relates to a sacrificial cathodic protection system wherein the power supply for the current control device is an integral part of said system. According to this aspect of the invention, the improvement comprises said device, said sacrificial anode and a differential amplifier or comparator to improve the switching characteristics of said switching device. It also comprises an electrode, which with the said anode provides the supply voltage for said comparator. A first circuit means connects the structure to the input of the said comparator. A second circuit means connects the output of said comparator to the gate of said switching device and third and fourth circuit means connect said device between the said anode and the said structure.

Two additional circuit means are also provided to connect said anode and said reference element to the power supply inputs of said comparator. The said comparator has a predetermined characteristic and an internal reference, depending on the type of said sacrificial anode used. It has been found that the above improvements are best validated in terms of anode savings and optimized protection efficiency when applied to structures subject to periodical immersion, e.g. offshore, marine and harbour structures, subject to tidal effects, underground structures and pipeline systems subject to fluctuating ground-water levels, the internal structures of ballast and cargo-ballast tanks on ships and shore installations.

BRIEF DESCRIPTION OF THE DRAWINGS

The foregoing and other objects and benefits of the invention will be more fully set forth below in connection with the best mode contemplated by the inventor of carrying out the invention, and in connection with which there are illustrations provided in the drawings, wherein:

FIG. 1 is schematic diagram illustrating the elements involved in a system in accordance with the invention;

FIG. 2 is a fragmentary cross-sectional indication of a structure to be protected along with an anode mounted adjacent thereto, and having a schematic circuit diagram of a current control device;

FIG. 3 is a schematic circuit diagram indicating one system for connecting the current control device into the protective circuit;

FIG. 4 is another schematic circuit diagram like FIG. 3 including a differential amplifier or comparator to enhance the switching characteristics of the current control device.

FIG. 5 is a graph indicating the conditions of current flow applicable to a control system according to the invention.

DESCRIPTION OF THE PREFERRED EMBODIMENTS

FIG. 1 illustrates a schematic indication of a sacrificial anode type protective system which includes a cathodic material structure 11 and a current control element 12 with an anode 13. The anode 13 and at least part of the structure 11 are immersed in an electrolyte 16. The indicated system also may have a reference electrode 17 that is also immersed in the electrolyte 16.

The physical form of the various elements indicated in the FIG. 1 schematic may, of course, take a variety of forms. FIG. 2 indicates one arrangement, wherein a sacrificial anode 20 is mounted in proximity to a material structure 21. It will be understood that structure 21 may be a ballast or cargo-ballast tank or any installation subject to periodic immersion due to tidal effects or groundwater fluctuations. The anode 20 is, of course, mounted on the surface of the structure 21 so that it is in contact with the electrolyte. Anode 20 has a pair of supporting brackets 22 and 23 which are integrally part of the anode 20, at least in an electrical sense. The structure 21 has a corresponding pair of brackets 25 and 26, and there are bolts 28 and 29 that extend enouth the pairs of brackets 22, 26 and 23, 25, respectively. Also, there are electrically insulating separators 30 and 31, which keep the anode 20 electrically insulated from the cathodic material structure 21.

There is a semiconductor device 34 that is connected between the anode 20 and the structure 21, as indicated. Using modern semiconductor technology, devices can be produced which have desired cut-in voltages and low forward resistance in order to obtain improved results in accordance with this invention. In the system according to FIG. 2, the control device 34 will ideally have characteristics as illustrated in FIG. 5. Thus the ordinate of the FIG. 5 graph represents anode current, while the abscissa represents the potential or voltage. A curve 37 indicates the characteristics. It will be noted that there is a cut-in potential 38, below which substantially no current flow takes place. Then, for a given material of the anode 20 and for a given material of the structure 21, there is a protective potential point 41 which is between the cut-in potential 38 and a maximum (or original structure) potential point 42. It will be understood that the so-called "original structure" potential 42 depends upon the electrochemical characteristics of the structure and anode materials, and it is such that the current flow would maximize or reach an upper limit 39 related to type and size of the anode. Then, as the protection effect takes place, the potential is reduced or shifted towards zero until the protective potential point 41 is reached. Consequentially, the polarization will stabilize close to the protective potential in such a manner as to limit the current flow to a low level while maintaining the protection, and at the same time economizing on the amount of anode dissolution.

FIG. 3 illustrates the circuit of a preferred system in accordance with the invention. It has been discovered that the characteristics of a field effect type of semi-conductor are especially applicable to the protection system. Thus, there is a field effect or a MOS (metal oxide silicon) field effect device 45 which has a gate 46 with a circuit connection 49 connecting the gate to a reference electrode 50. The device 45 has one junction connected to an anode 53 via a circuit connection 54. The other junction (of device 45) is connected to a cathodic structure 56 via a circuit connection 57. It will be noted that the potential of the structure 56 itself, with respect to the potential of the reference electrode, directly effects the gate 46 to control the protective current flow to the structure 56 as described above. Another manner of connecting the device 45 is illustrated in FIG. 4. A differential amplifier or comparator 60 is used to enhance the switching characteristics of the device 45 and to relax its design parameters.

The differential amplifier or comparator 60 compares the potential of the structure 56, connected to the input of the amplifier by circuit connection 65, to the protective potential 41.

The amplified potential difference appearing at the output of the comparator 60 is used to trigger the switching device 45 via a circuit connection 62 from gate 46 to the output of the amplifier or comparator 60.

The potential difference developed in the electrolyte 16 between the anode 53 and an electrode 61, is used as a power supply via circuit connections 63 and 64 for the amplifier or comparator 60. It is understood that the electrode 61 can be any material cathodic to the anode 53.

For instance, if the electrolyte is seawater with a resistivity of 25 ohm.cm, the anode 53 material magnesium, and the electrode 61 material graphite, a supply voltage of about 1.8 volts will be available to the amplifier or comparator 60. A slightly lower voltage will be available to trigger the switching device 45 via gate 46. The higher trigger voltage thus obtained relaxes the design criteria for the switching device 45.

MOSFET devices with trigger voltages in the order of 1.0 volt, 'on' resistances of 0.02 ohm and current switching capabilities to 28 amperes, are currently available.

While particular embodiments according to the invention have been described above in considerable detail in accordance with the applicable statutes, this is not to be taken as in any way limiting the invention but merely as being descriptive thereof.

I claim:

1. In a sacrificial anode type of cathodic protection system, said system comprising a cargo-ballast tank of a petroleum product tank ship subject to being contacted periodically by an electrolyte, the improvement comprising
   a field effect type metal oxide silicon semi-conductor device having a pair of junctions and a gate,
   an anode for contacting said electrolyte to provide said protection,
   an electrode for contacting said electrolyte,
   a comparator,
   first circuit means for connecting one junction of said device to said structure,
   second circuit means for connecting the other junction of said device to said anode,
   third circuit means for connecting said electrode to said comparator
   fourth circuit means for connecting the output of said comparator to said gate,
   fifth circuit means for connecting the input of said comparator to one of said junctions of said device, and
   sixth circuit means for connecting the other of said junctions of said device to said comparator.

* * * * *